United States Patent [19]

Harrison et al.

[11] Patent Number: 6,011,732
[45] Date of Patent: Jan. 4, 2000

[54] SYNCHRONOUS CLOCK GENERATOR INCLUDING A COMPOUND DELAY-LOCKED LOOP

[75] Inventors: Ronnie M. Harrison; Brent Keeth, both of Boise, Id.

[73] Assignee: Micron Technology, Inc., Boise, Id.

[21] Appl. No.: 08/915,185

[22] Filed: Aug. 20, 1997

[51] Int. Cl.[7] .................................................. G11C 7/00
[52] U.S. Cl. .......................... 365/194; 365/194; 365/233; 365/191
[58] Field of Search .............................. 365/194, 230.02, 365/233, 185.25, 191; 360/51; 327/141

[56] References Cited

U.S. PATENT DOCUMENTS

| | | | |
|---|---|---|---|
| 3,633,174 | 1/1972 | Griffin | 340/172.5 |
| 4,077,016 | 2/1978 | Sanders et al. | 331/4 |
| 4,096,402 | 6/1978 | Schroeder et al. | 307/362 |
| 4,404,474 | 9/1983 | Dingwall | 307/260 |
| 4,481,625 | 11/1984 | Roberts et al. | 370/85 |
| 4,511,846 | 4/1985 | Nagy et al. | 328/164 |
| 4,514,647 | 4/1985 | Shoji | 307/269 |
| 4,600,895 | 7/1986 | Landsman | 331/1 A |

(List continued on next page.)

FOREIGN PATENT DOCUMENTS

| | | |
|---|---|---|
| 0 295 515 A1 | 12/1988 | European Pat. Off. . |
| 0 406 786 a1 | 1/1991 | European Pat. Off. . |
| 0 450 871 A2 | 10/1991 | European Pat. Off. . |
| 0 476 585 A3 | 3/1992 | European Pat. Off. . |
| 0 655 741 A2 | 5/1995 | European Pat. Off. . |
| 0 655 834 A1 | 5/1995 | European Pat. Off. . |
| 0 680 049 A2 | 11/1995 | European Pat. Off. . |
| 0 703 663 A1 | 3/1996 | European Pat. Off. . |
| 0 704 848 A3 | 4/1996 | European Pat. Off. . |
| 0 704 975 A1 | 4/1996 | European Pat. Off. . |
| 0 767 538 A1 | 4/1997 | European Pat. Off. . |
| 6-1237512 | 10/1986 | Japan . |
| 2-112317 | 4/1990 | Japan . |
| 4-135311 | 5/1992 | Japan . |
| 5-136664 | 6/1993 | Japan . |
| 5-282868 | 10/1993 | Japan . |
| 0-7319577 | 12/1995 | Japan . |
| WO 94/29871 | 12/1994 | WIPO . |
| WO 95/22200 | 8/1995 | WIPO . |
| WO 95/22206 | 8/1995 | WIPO . |
| WO 96/10866 | 4/1996 | WIPO . |
| WO 97/14289 | 4/1997 | WIPO . |
| WO 97/42557 | 11/1997 | WIPO . |

OTHER PUBLICATIONS

Alvarez, J. et al. "A Wide–Bandwidth Low Voltage PLL for PowerPC ™ Microprocessors" IEEE IEICE Trans. Electron., vol. E–78. No. 6, Jun. 1995, pp. 631–639.

Anonymous, "Programmable Pulse Generator", IBM Technical Disclosure Bulletin, vol. 17, No. 12, May 1975, pp. 3553–3554.

*Primary Examiner*—David Nelms
*Assistant Examiner*—Thong Le
*Attorney, Agent, or Firm*—Seed and Berry LLP

[57] ABSTRACT

A synchronous clock generator is comprised of a delay-locked loop for producing a plurality of signals in response to an external clock signal. Each of the plurality of signals is delayed a predetermined period of time with respect to the external clock signal. A plurality of multiplexers is responsive to the plurality of signals for producing at least one clock signal in response to control signals input to the plurality of multiplexers. A clock driver is provided for driving the clock signal. A variable delay circuit is positioned to delay the external clock signal before input to the delay-locked loop. A compound feedback loop is responsive to certain of the plurality of signals for producing a control signal input to the variable delay circuit.

33 Claims, 10 Drawing Sheets

U.S. PATENT DOCUMENTS

| | | | |
|---|---|---|---|
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 307/269 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,212,601 | 5/1993 | Wilson | 360/51 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,311,483 | 5/1994 | Takasugi | 365/233 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,410,263 | 4/1995 | Waizman | 327/141 |
| 5,416,436 | 5/1995 | Rainard | 327/270 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,446,696 | 8/1995 | Ware et al. | 365/222 |
| 5,448,193 | 9/1995 | Baumert et al. | 327/156 |
| 5,451,898 | 9/1995 | Johnson | 327/563 |
| 5,457,407 | 10/1995 | Shu et al. | 326/30 |
| 5,465,076 | 11/1995 | Yamauchi et al. | 331/179 |
| 5,473,274 | 12/1995 | Reilly et al. | 327/159 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,489,864 | 2/1996 | Ashuri | 327/161 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/150 |
| 5,544,203 | 8/1996 | Casasanta et al. | 375/376 |
| 5,552,727 | 9/1996 | Nakao | 327/159 |
| 5,568,075 | 10/1996 | Curran et al. | 327/172 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon et al. | 326/30 |
| 5,578,941 | 11/1996 | Sher et al. | 326/34 |
| 5,579,326 | 11/1996 | McClure | 371/61 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,594,690 | 1/1997 | Rothenberger et al. | 365/189.01 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,621,739 | 4/1997 | Sine et al. | 371/22.1 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/12 |
| 5,719,508 | 2/1998 | Daly | 327/12 |
| 5,751,665 | 5/1998 | Tanoi | 368/120 |
| 5,789,947 | 8/1998 | Sato | 327/3 |

OTHER PUBLICATIONS

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No.2, Feb. 1996, pp. 212–220.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984,, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Descriptive literature entitled, "400MHz SLDRAM, 4M X 16 SLDRAM Pipelined, Eight Bank, 2.5 V Operation," SLDRAM Consortium Advance Sheet, published throughout the United States, pp. 1–22.

Donnelly, K. et al., "A 660 MB/s Interface Megacell Portable Circuit in 0.3 μm–0.7 μm CMOS ASIC", IEEE Journal of Solid–State Circuits, vol. 31, No. 12, Dec. 1996, pp. 1995–2001.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6μm CMOS SOG", IEEE Custom Integrated Circuits Conference, 1992, pp. 27.6.1–27.6.4.

Kim, B. et al., "A 30MHz High–Speed Analog/Digital PLL in 2μm CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–μs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s Dram", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid Sate Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency– and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol.E–79–C. No. 7, Jul. 1996, pp. 898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

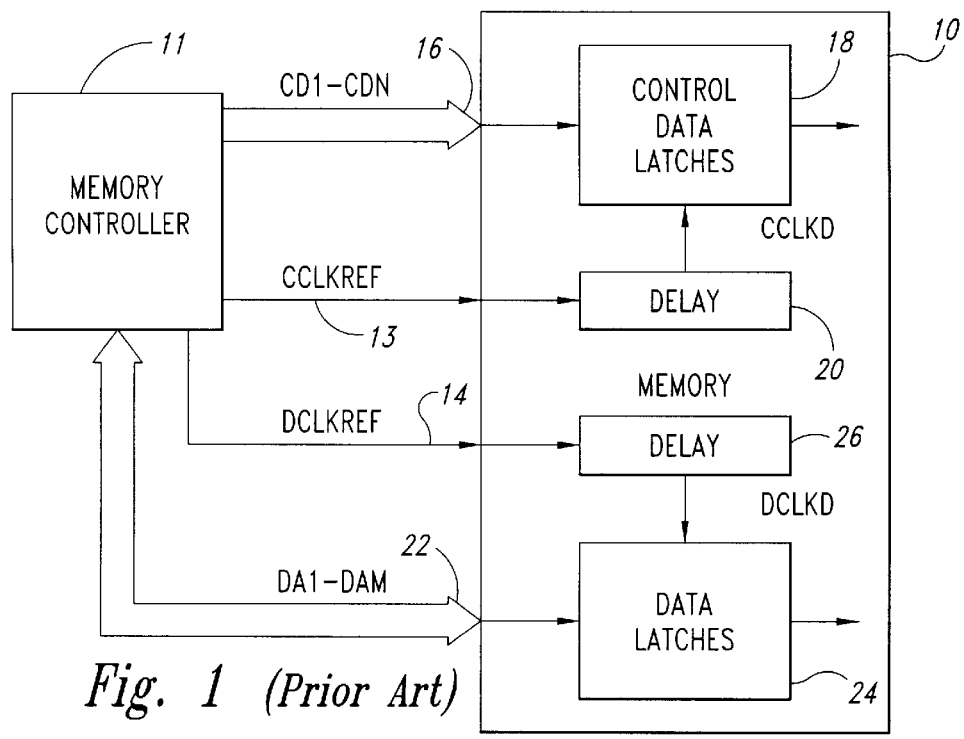
Fig. 1 (Prior Art)
Fig. 2A
CD1-CDN
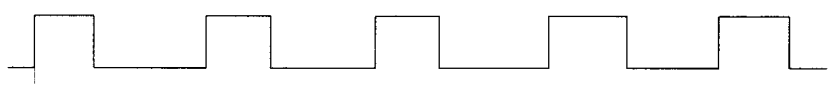
Fig. 2B
CCLKREF
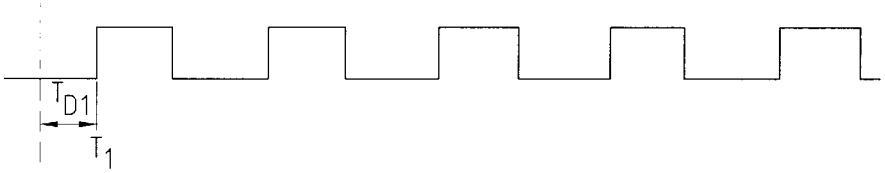
Fig. 2C
CCLKD
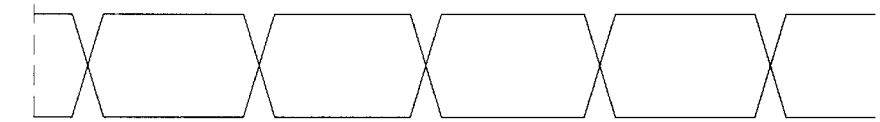
Fig. 2D
DA1-DAM
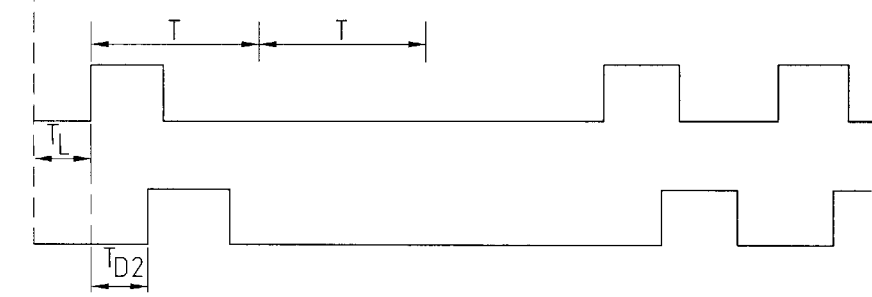
Fig. 2E
DCLKREF
Fig. 2F
DCLKD

SYNCHRONOUS CLOCK GENERATOR INCLUDING A COMPOUND DELAY-LOCKED LOOP

CROSS REFERENCE TO RELATED APPLICATION

The subject matter of this application is related to the subject matter of U.S. patent application Ser. No. 08/799,661, filed Feb. 11, 1997 and entitled Synchronous Clock Generator Including Delay-Locked Loop, which is assigned to the same assignee as the present invention.

BACKGROUND OF THE INVENTION

1. Field of the Invention

The present invention is directed generally to the field of integrated circuits and, more particularly, to the generation of clock signals for controlling the operation of such circuits.

2. Description of the Background

Many high-speed integrated circuit devices, such as synchronous dynamic random access memories (SDRAM), microprocessors, etc. rely upon clock signals to control the flow of commands, data, addresses, etc., into, through, and out of the devices. Additionally, new types of circuit architectures such as RAMBUS and SLDRAM require individual parts to work in unison even though such parts may individually operate at different speeds. As a result, the ability to control the operation of a part through the generation of local clock signals has become increasingly more important.

Typically, operations are initiated at the edges of the clock signals (i.e., transitions from high to low or low to high). To more precisely control the timing of operations within the device, each period of a clock signal is sometimes divided into subperiods so that certain operations do not begin until shortly after the clock edge.

One method for controlling the timing of operations within a period of a clock signal generates phase-delayed versions of the clock signal. For example, to divide the clock period into four subperiods, phase delayed versions are produced that lag the clock signal by 90°, 180° and 270°, respectively. Edges of the phase-delayed clock signals provide signal transitions at the beginning or end of each subperiod that can be used to initiate operations.

An example of such an approach is shown in FIGS. 1 and 2A–2F where the timing of operations in a memory device 10 is defined by an externally provided control clock reference signal CCLKREF and an externally provided data clock reference signal DCLKREF. The reference clock signals CCLKREF, DCLKREF are generated in a memory controller 11 and transmitted to the memory device 10 over a control clock bus 13 and a data clock bus 14, respectively. The reference clock signals CCLKREF, DCLKREF have identical frequencies, although the control clock reference signal CCLKREF is a continuous signal and the data clock reference signal DCLKREF is a discontinuous signal, i.e., the data clock reference signal DCLKREF does not include a pulse for every clock period T, as shown in FIGS. 2B and 2E, respectively. Although the reference clock signals CCLKREF, DCLKREF have equal frequencies, they may be phase shifted by a lag time $T_L$ upon arrival at the memory device 10 due to differences in propagation times, such as may be produced by routing differences between the control clock bus 13 and the data clock bus 14.

Control data CD1–CDN (FIG. 2A) arrive at respective input terminals 16 substantially simultaneously with pulses of the control clock reference signal CCLKREF and are latched in respective control data latches 18. However, if the device attempts to latch the control data CD1–CDN immediately upon the edge of the control clock reference signal CCLKREF, the control data may not have sufficient time to develop at the input terminals 16. For example, a voltage corresponding to a first logic state (e.g., a "0") at one of the input terminals 16 may not change to a voltage corresponding to an opposite logic state (e.g., a "1") by the time the data are latched. To allow time for the control data CD1-CDN to fully develop at the input terminals 16, the control data are latched at a delayed time relative to the control clock reference signal CCLKREF. To provide a clock edge to trigger latching of the control data CD1–CDN at the delayed time $t_1$, a delay circuit 20 delays the control clock reference signal CCLKREF by a delay time $T_{D1}$ to produce a first delayed control clock signal CCLKD (FIG. 2C). Edges of the first delayed control clock signal CCLKD activate the control data latches 18 to latch the control data CD1–CDN at time $t_1$.

Data DA1–DAM (FIG. 2D) arrive at data terminals 22 substantially simultaneously with the data clock reference signal DCLKREF (FIG. 2E). Respective data latches 24 latch the data DA1–DAM. As with the control data CD1–CDN, it is desirable that the data DA1–DAM be latched with a slight delay relative to transitions of the data clock reference signal DCLKREF to allow time for signal development at the data terminals 22. To provide a delayed clock edge, a delay circuit 26 delays the data clock reference signal DCLKREF (FIG. 2E) to produce a phase-delayed data clock signal DCLKD (FIG. 2F) that is delayed relative to the data clock reference signal DCLKREF by the delay time $T_{D2}$.

For latching both control data CD1–CDN and data DA1–DAM, it is often desirable to allow some adjustment of the phase delay. For example, if the clock frequencies change, the duration of the subperiods will change correspondingly. Consequently, the delayed clock signals CCLKD, DCLKD may not allow sufficient signal development time before latching the control data or data, respectively. Also, variations in transmission times of control data, data, or clock signals may cause shifts in arrival times of control data CD1–CDN or data DA1–DAM relative to the reference clock signals of the memory device 10.

One possible approach to producing a variable delay is for the control clock generator to employ a delay-locked loop 28 driven by the control clock reference signal CCLKREF, as shown in FIG. 3A. The control clock reference signal CCLKREF is input to a conventional multiple output variable delay line 30 such as that described in Maneatis, "Low-Jitter Process-Independent DLL and PLL Based on Self-Biased Techniques," *IEEE Journal of Solid-State Circuits* 31(11):1723–1732, November 1996. The delay line 30 is a known circuit that outputs multiple delayed signals CCLK1–CCLKN with increasing lags relative to the control clock reference signal CCLKREF. The delays of the signals CCLK1–CCLKN are variably responsive to a control signal Vcon received at a control port 32.

A feedback loop, formed by a comparator 34 and an integrator 36, produces the control signal Vcon. The feedback loop receives the control clock reference signal CCLKREF at one input of the comparator 34 and receives one of the output signals CCLKN from the delay line 30 as a feedback signal at the other input of the comparator 34. The comparator 34 outputs a compare signal Vcomp that is integrated by the integrator 36 to produce the control signal Vcon.

As is known, the control signal Vcon will depend upon the relative phases of the control clock reference signal CCLKREF and the feedback signal CCLKN. If the feedback signal CCLKN leads the control clock reference signal CCLKREF, the control signal Vcon increases the delay of the delay line 30, thereby reducing the magnitude of the control signal Vcon until the feedback signal CCLKN is in phase with the control clock reference signal CCLKREF. Similarly, if the feedback signal CCLK lags the control clock reference signal CCLKREF, the control signal Vcon causes the delay line 30 to decrease the delay until the feedback signal CCLKN is in phase with the control clock reference signal CCLKREF. A similar delay-locked loop 37 produces the delayed data clock signals DCLK1–DCLKN in response to the data clock reference signal DCLKREF as shown in FIG. 3B.

As the circuitry for generating the clock signals becomes more and more complex, the delay associated with that circuitry becomes greater and greater. Furthermore, process variations and operating temperatures affect the circuitry generating the clock signals causing the delay to vary. Such a variable delay reintroduces some of the same problems that the clock generation circuitry is designed to eliminate. Thus, there is a need for clock generation circuitry that compensates for the variable delay introduced by the clock generation circuitry itself.

SUMMARY OF THE INVENTION

The present invention solves the aforementioned problem by providing a tunable, delay-locked loop. The tunable, delay-locked loop of the present invention is comprised of a receiver for receiving a clock signal. A delay line produces a plurality of signals in response to the clock signal. Each of the plurality of signals is delayed a predetermined period of time with respect to the clock signal. A first feedback loop is responsive to the delay line for producing a first feedback signal which is input to the delay line. A variable delay circuit is interposed between the receiver and the delay line. A second feedback loop is responsive to the delay line for producing a second feedback signal which is input to the variable delay circuit.

The present invention is also directed to a synchronous clock generator which is comprised of a delay-locked loop for producing a plurality of signals in response to an external clock signal. Each of the plurality of signals is delayed a predetermined period of time with respect to the external clock signal. A plurality of multiplexers is responsive to the plurality of signals for producing at least one clock signal in response to control signals input to the plurality of multiplexers. A clock driver is provided for driving the clock signal. A variable delay circuit is positioned to delay the external clock signal before input to the delay-locked loop. A compound feedback loop is responsive to certain of the plurality of signals for producing a control signal input to the variable delay circuit.

According to another embodiment of the present invention, a delay line is slaved to the delay-locked loop and a second variable delay circuit is slaved to the compound feedback loop. In that manner, the delay-locked loop may be responsive to a continuous control clock signal while the delay line may be responsive to a discontinuous data clock signal.

By using a second or compound feedback loop to control a variable delay circuit, the delay associated with the clock generation circuitry itself is compensated. Furthermore, the use of a first receiver for receiving the clock signal for use in the delay line and a second receiver for receiving the clock signal for use in the compound feedback loop enables each of the receivers to be optimized. In that manner, the first receiver can be optimized for use in conjunction with the delay-locked loop whereas the second receiver can be matched to the receiver used to receive the data. That enables a better lock with respect to the incoming data. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein:

FIG. 1 is a block diagram of a prior art memory system including a memory device and a memory controller linked by control data and data buses;

FIGS. 2A–2F are a signal timing diagram showing the timing of control signals, data, and clock signals in the memory system of FIG. 1;

DESCRIPTION OF THE PREFERRED EMBODIMENTS

Figure 4A:
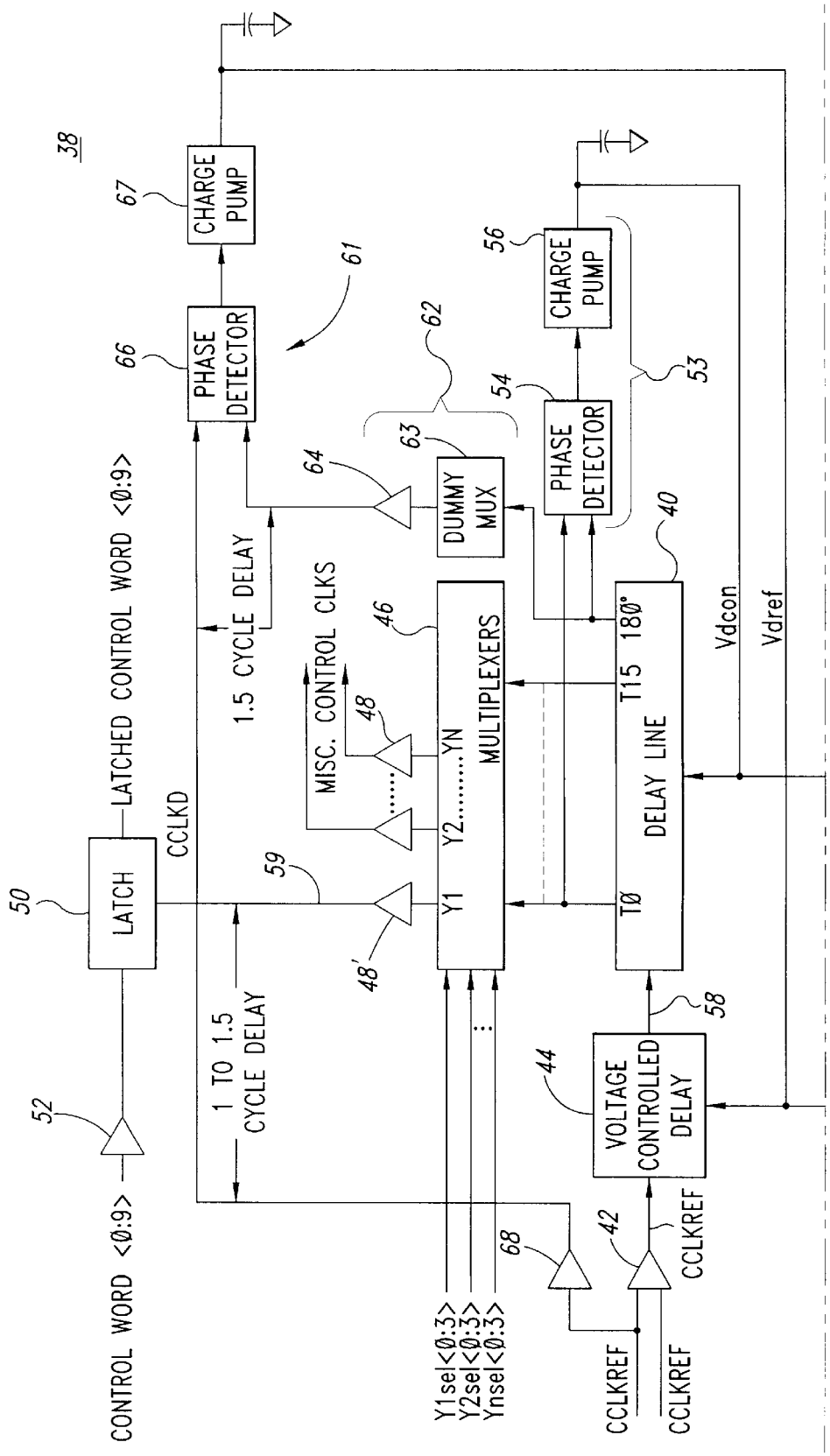
FIG. 4 is a block diagram of a synchronous clock generator including a compound delay-locked loop for tuning the delay of the delay locked-loop according to the teachings of the present invention.
Figure 4B:
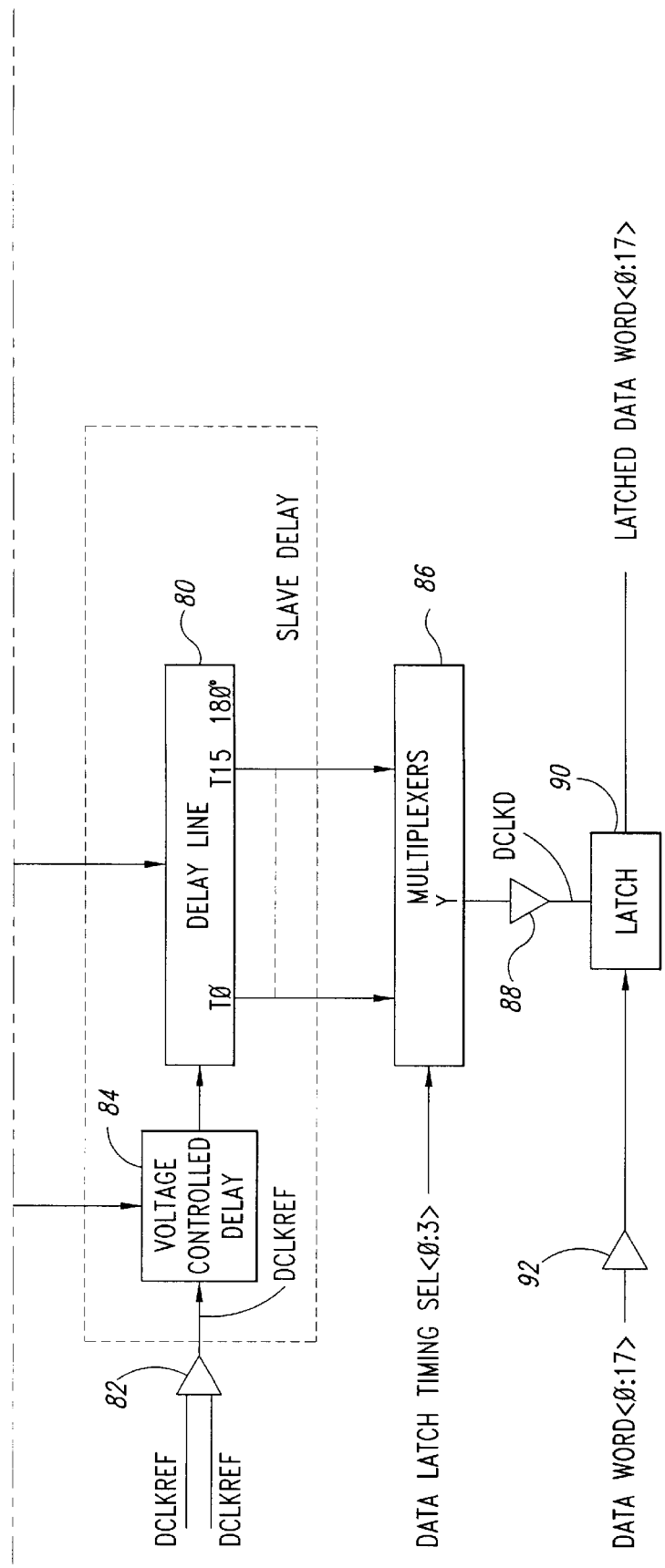

FIG. 4 is a block diagram of a synchronous clock generator circuit 38 including a compound delay-locked loop for tuning the delay of a delay-locked loop according to the teachings of the present invention. The circuit 38 illustrated in FIG. 4 is designed for use by a dynamic random access memory (DRAM) which is used in a SLDRAM architecture. Although the present invention is described with respect to a particular circuit used in a particular architecture, the reader will understand that the concepts of the present invention may be used in other circuits as well as other circuit architectures. The present invention may be employed wherever it is desirable to precisely control the production of local clock signals.

The circuit 38 includes a delay line 40 which may be constructed according to the teachings of the prior art as set forth in the article entitled "Low-Jitter Process-Independent DLL and PLL Based on Self-Biased Techniques." As is known in the art, the delay line 40 has a number of taps associated therewith. As shown in FIG. 4, the delay line 40 has taps labeled T0–T15, with the last tap labeled 180°. Alternatively, the delay line 40 may be a vernier voltage-controlled delay line 40 of the type disclosed in U.S. patent application Ser. No. 08/879,847 filed Jun. 20, 1997 and entitled Method And Apparatus For Generating A Sequence Of Clock Signals, which is assigned to the same assignee as the present invention.

The delay line 40 receives clock signals that are received at a differential receiver 42. The differential receiver 42 receives the signals CCLKREF, $\overline{\text{CCLKREF}}$. The present invention will work with a variety of receivers other than the differential receiver 42 illustrated in FIG. 4. The control clock reference signal CCLKREF is input to the delay line 40 through a voltage controlled delay circuit 44, which is described in greater detail hereinbelow. In the present invention, the period T of the control clock reference signal CCLKREF is one-half of the period typical in the prior art and uses both the rising and falling edges.

The outputs of the delay line 40 are input to a plurality of multiplexers 46 which produce clock signals input to clock drivers 48. One of the clock drivers 48' produces the delayed control clock signal CCLKD which is input to a latch 50. The latch 50 receives control data through a receiver 52 and latches that data in response to the clock signal output by the clock driver 48'. The latched control data is available at the output of the latch 50.

A first feedback loop 53 is comprised of a phase detector 54 and a charge pump 56. The phase detector 54 receives two signals from the delay line 40 such as the signal available at the T0 tap and the signal available at the 180° tap. From those signals, a control signal is generated which is input to the charge pump 56. Charge pump 56 produces a delay control voltage Vdcon input to the delay line 40. The first feedback loop 53 and the delay line 40 comprise a delay-locked loop.

Between node 58 and node 59, a substantial delay may be introduced due to the complexity of the circuitry between those nodes. That delay may vary depending upon process variations and temperatures. As a result, the clock signals available at the output of drivers 48 may not be as tightly locked to the input clock as desirable. The present invention overcomes that problem by providing the delay line 40 with a second, or compound, feedback loop 61. The second feedback loop 61 is comprised of a delay matching circuit 62, a phase detector 66, and a charge pump 67. The delay matching circuit 62 is comprised of a dummy multiplexer 63 and a dummy clock driver 64. The purpose of the dummy multiplexer and dummy clock driver 63, 64, respectively, is to match the delay of the multiplexers 46 and clock drivers 48. The phase detector 66 receives a signal from the dummy clock driver 64. The phase detector 66 receives the control clock reference signal CCLKREF through a receiver 68. The receiver 68 is designed to match the receiver 52 because the receiver 52 (which receives the control data) may not have the same characteristics as the differential receiver 42. Because the control data received by the receiver 52 is in sync with the control clock reference signal CCLKREF, matching the receiver 68 to the receiver 52 ensures a better lock as parameters (e.g., voltage, temperature, clock frequency, etc.) change.

The phase detector 66 and charge pump 67 work in the same manner as the phase detector 54 and charge pump 56. Based on the signals input to the phase detector 66, the charge pump 67 produces a reference delay control voltage Vdref which is input to the voltage controlled delayed circuit 44. As a result, the delay-locked loop can be tuned by the second feedback loop 61 to add or subtract delay to the loop by controlling the voltage control delay circuit 44. In that manner, the delay between nodes 58 and 59 can be compensated to ensure an exact lock on the control clock reference signal CCLKREF.

The SLDRAM standard requires differential clock receivers and single-ended data receivers as shown in FIG. 4. For various reasons, a differential receiver, such as receiver 42, used in a single-ended mode (with the other input connected to a reference) is not necessarily optimum. To allow different clock and data receiver types (with differing delays and differing delay variations versus temperature and voltage) to be used, the receiver 68 has been added. As discussed, the receiver 68 is identical to the receiver 52 thereby facilitating clock timing which stays in sync with the data receiver 52. Differential receiver 42 can therefore be optimized for a minimum duty cycle error, etc., without concern for delay variation matching with receiver 52. Minor duty cycle errors in receiver 68 tend to be averaged out by the phase detector characteristics.

Completing the description of FIG. 4, the circuitry used for receiving the control clock reference signal and the control data is duplicated for the data clock reference signal and the data except that a delay line 80 is slaved to the delay-locked loop for the control clock reference signal. As a result, the delay line 80 is provided with the delay control voltage Vdcon instead of being provided with a first feedback loop as was delay line 40. Similarly, a second voltage controlled delay circuit 84 receives the reference delay control voltage Vdref. The data clock reference signals DCLKREF and $\overline{\text{DCLKREF}}$ are input to a differential receiver 82. The outputs of the delay line 80 are input to multiplexers 86 which produce the delay data clock signal DCLKD input to a clock driver 88 for operating a latch 90. Latch 90 latches data words which are input to a receiver 92.

Because the delay of the second delay line 80 is controlled by the delay control voltage Vdcon, and because the delay of the second voltage controlled delay circuit 84 is controlled by the reference delay control voltage Vdref, the overall delay of the second delay line 80 is substantially equal to that of the delay line 40. Thus, the present invention enables the separate delay-locked loop of the prior art (37 in FIG. 3B) to be eliminated. By slaving the delay line 80, the clock periods of the control clock reference signal CCLKREF and the data clock reference signal DCLKREF are matched. Because the delay time of the delayed data clock signal DCLKD is controlled by the delay-locked loop used to produce the delayed control clock signal CCLKD, the delayed data clock signal DCLKD has a fixed phase relationship relative to the discontinuous data clock reference signal DCLKREF without requiring locking to the discontinuous data clock reference signal DCLKREF.

Figure 3A:
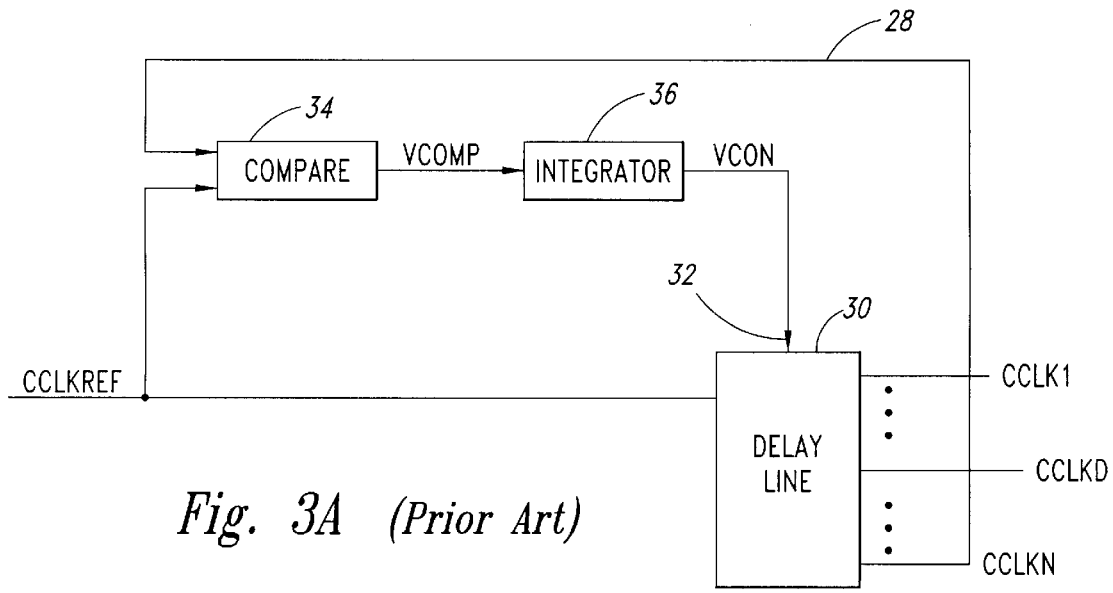
FIGS. 3A and 3B are block diagrams of a pair of prior art delay-locked loops separately driven by control and data reference clock signals.
Figure 3B:
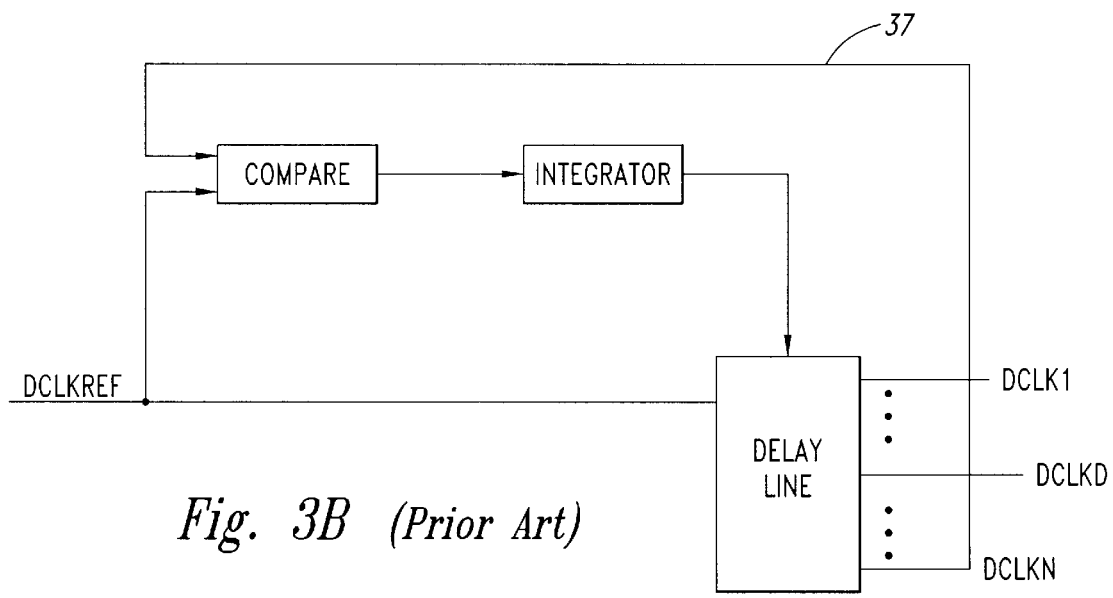

By eliminating the delay-locked loop 37 of FIG. 3B, and establishing a delay time with reference to the control clock reference signal CCLKREF, the circuit 38 establishes the delay time with reference to a continuous signal (CCLKREF) rather than a discontinuous signal (DCLKREF). Consequently, the circuit 38 provides a continuously controlled delay time while eliminating the difficulties of attempting to lock a delay-locked loop to a discontinuous signal.

Figure 5:
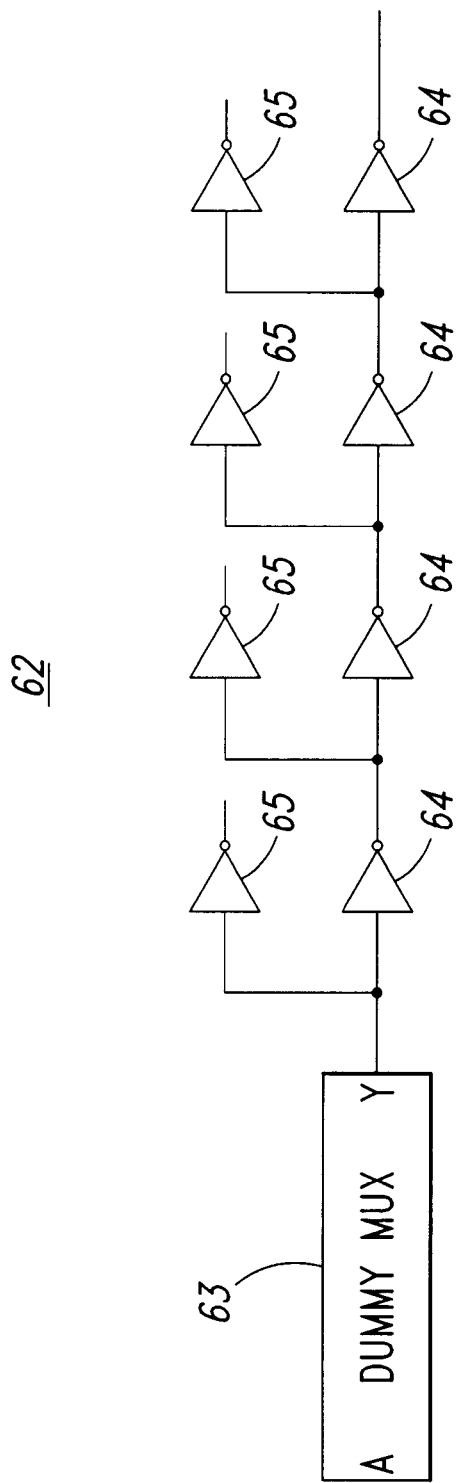
FIG. 5 illustrates one embodiment of a phase matching circuit that may be used in the present invention.
Figure 6:
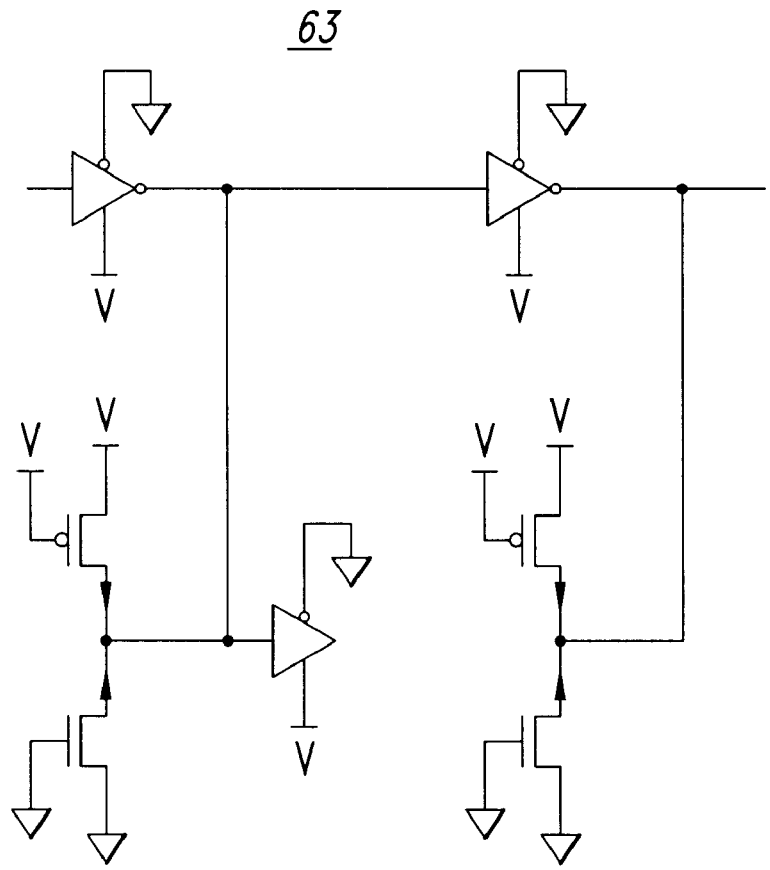
FIG. 6 illustrates one embodiment of the dummy mux shown in FIG. 5.

In FIG. 5, one embodiment of a phase matching circuit 62 that may be used in the present invention is illustrated. As shown, the phase matching circuit 62 is comprised of a dummy multiplexer 63 and a plurality of serially connected inverters 64. Each of the inverters 64 has an inverter 65 connected thereto to provide a capacitive load. The four inverter string and the dummy multiplexer 63 have a delay which matches the delay through the multiplexers 46 and one of the clock drivers 48. FIG. 6 illustrates one embodiment of the dummy multiplexer 63 shown in FIG. 5. Those of ordinary skill in the art will recognize that other embodiments for implementing the delay matching circuit 62 may be used.

Figure 7:
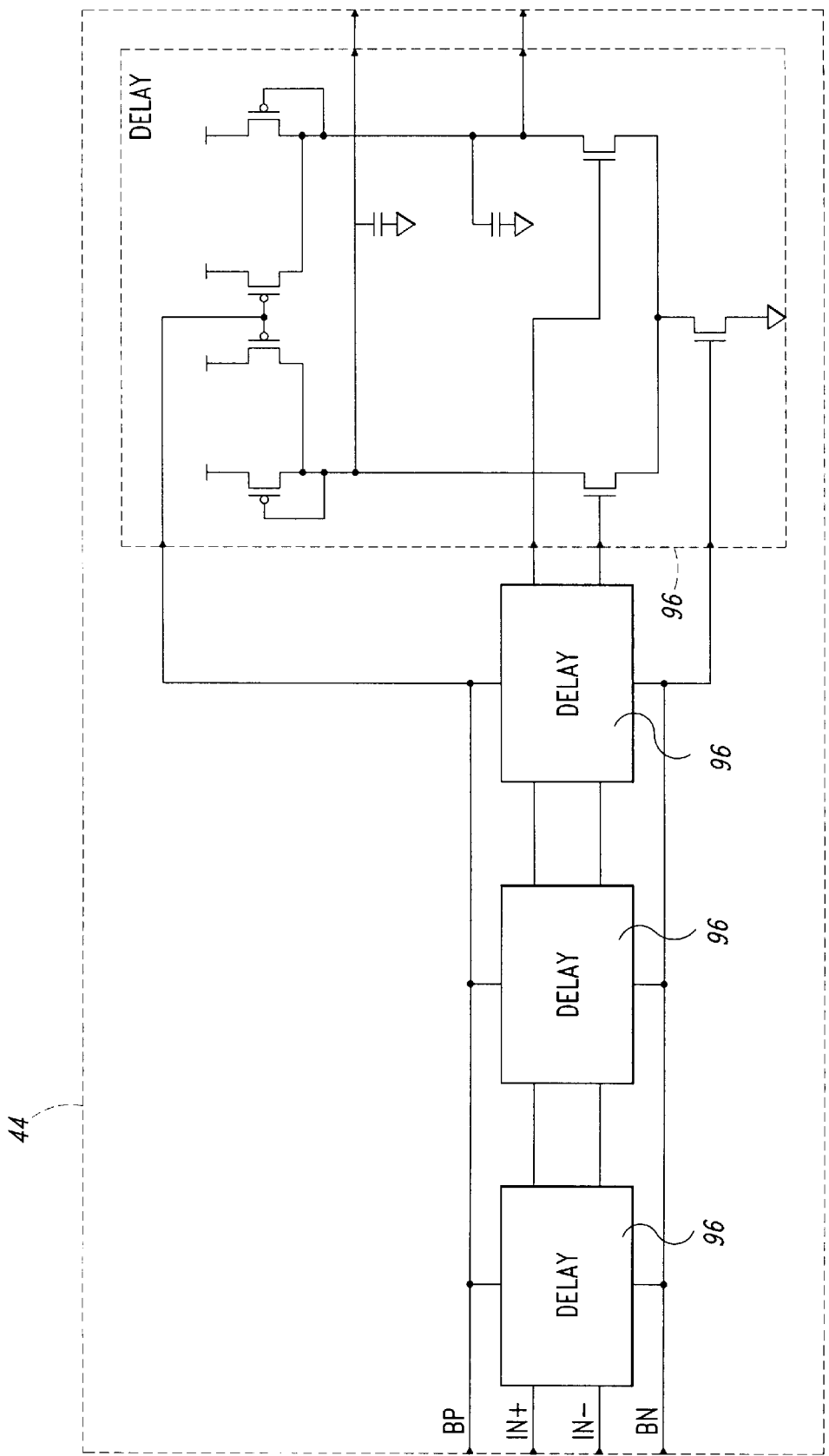
FIG. 7 illustrates one embodiment of the voltage controlled delay circuit shown in FIG. 4.

FIG. 7 illustrates one embodiment of the voltage controlled delay circuit 44 shown in FIG. 4. The voltage controlled delay circuit 44 may be comprised, in one embodiment, of four identical voltage controlled, variable delay stages 96. As shown in FIG. 7, one of the delay stages 96, the far right delay stage, is shown as an electrical schematic. Those of ordinary skill in the art will recognize that other types of and numbers of delay stages 96 may be used.

Figure 8A:
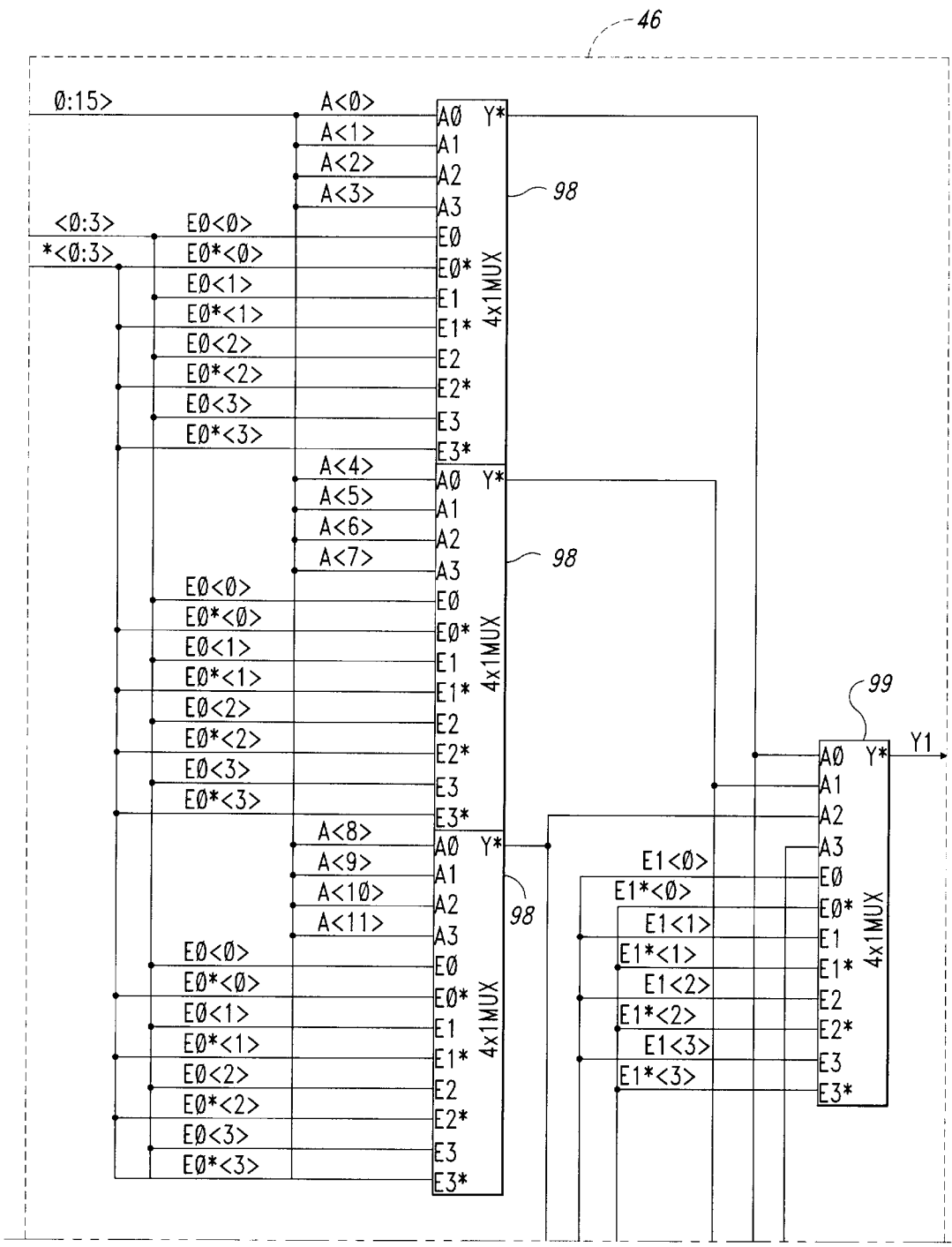
FIG. 8 illustrates one embodiment of the multiplexers shown in FIG. 4.
Figure 8B:
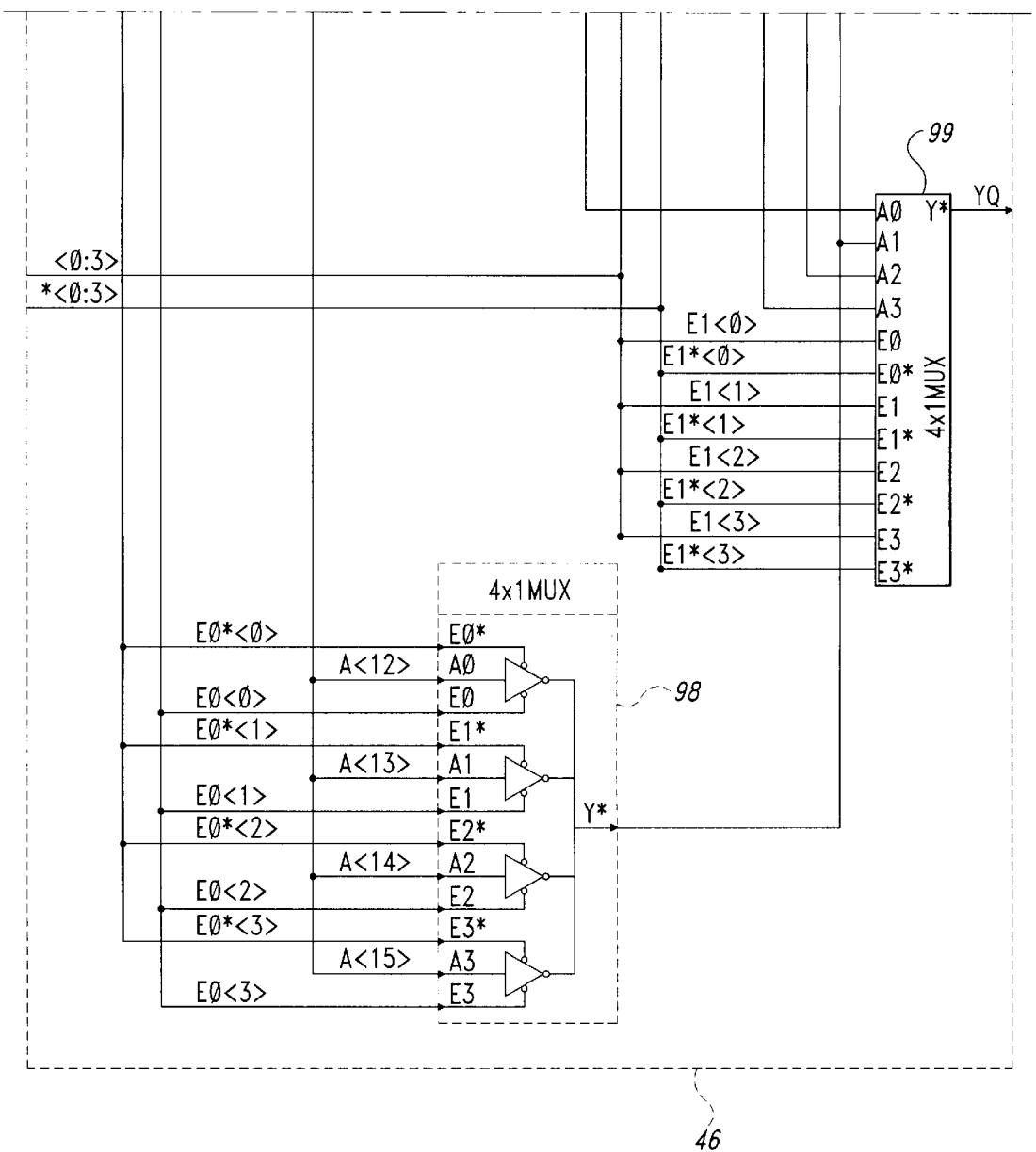

FIG. 8 illustrates one embodiment of the multiplexers 46 shown in FIG. 4. As seen in FIG. 8, a first column of 4×1 multiplexers 98 receives the signals produced by the delay line 40. The multiplexers 98 are controlled by two control bits. Two additional 4×1 multiplexers 99 are provided which are responsive to the four 4×1 multiplexers 98. The two additional 4×1 multiplexers 99 are controlled by two additional control bits. By interconnecting the multiplexers 99 and 98 as shown in FIG. 8, and by controlling the second multiplexers 99 with two additional control bits, clock signals Y1 and YQ may be produced with a minimum amount of logic.

Figure 9:
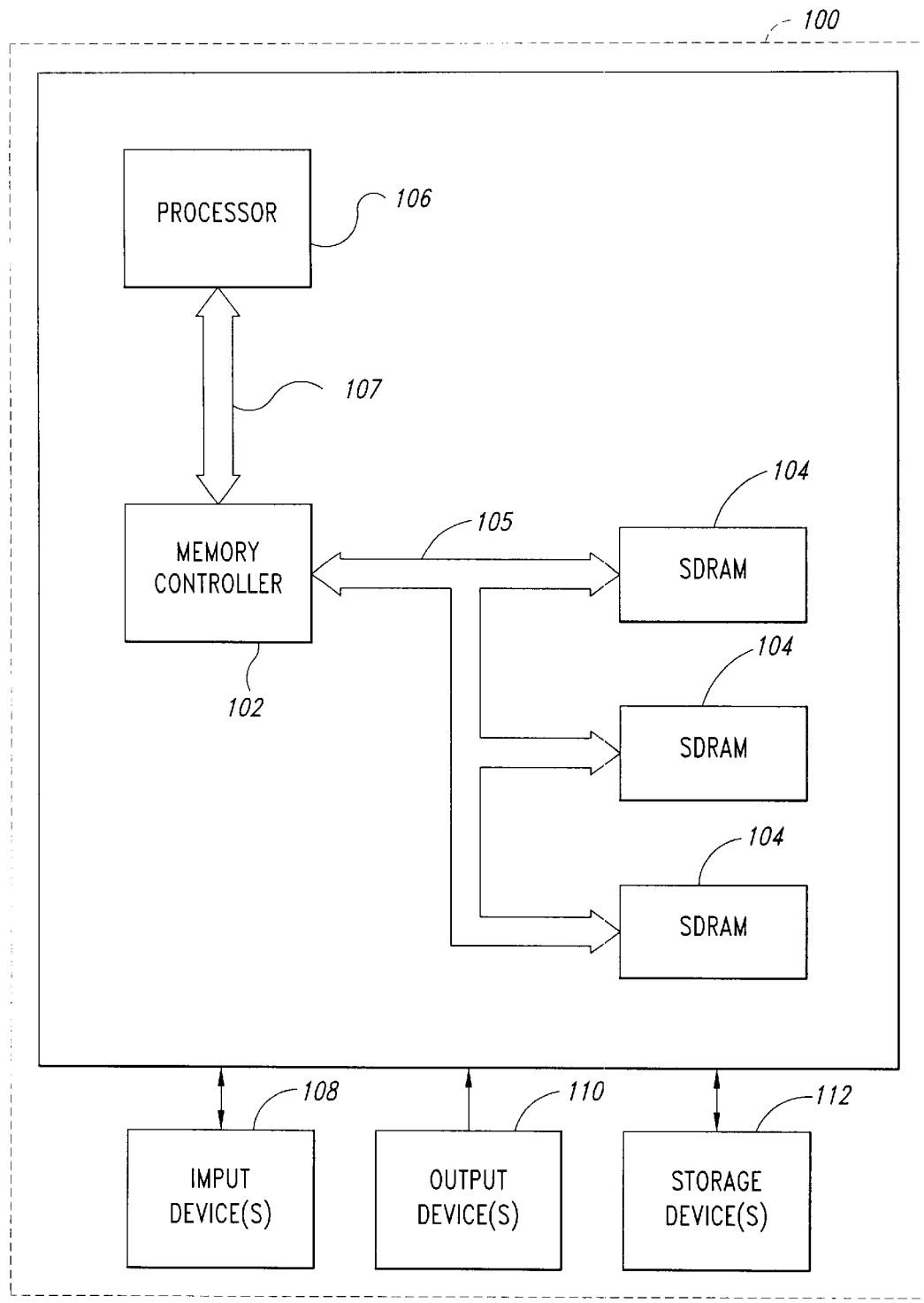
FIG. 9 is a block diagram of a system in which the invention shown in FIG. 4 may be used.

FIG. 9 is a block diagram of a computer system 100. The computer system 100 utilizes a memory controller 102 in communication with SDRAMs 104 through a bus 105. The memory controller 102 is also in communication with a processor 106 through a bus 107. The processor 106 can perform a plurality of functions based on information and data stored in the SDRAMs 104. One or more input devices 108, such as a keypad or a mouse, are connected to the processor 106 to allow an operator to manually input data, instructions, etc. One or more output devices 110 are provided to display or otherwise output data generated by the processor 106. Examples of output devices include printers and video display units. One or more data storage devices 112 may be coupled to the processor 106 to store data on, or retrieve information from, external storage media. Examples of storage devices 112 and storage media include drives that accept hard and floppy disks, tape cassettes, and CD read only memories.

The present invention is also directed to a method of tuning a synchronous clock generator which produces clock signals in response to an external clock input signal. The method is comprised of the steps of determining the amount of delay associated with the signal lines from the input of a delay line to the output of a clock driver. The second step of the method is delaying the input of a clock signal to the delay-locked loop such that the output of the clock generator is locked in a fixed phase or time relationship with the external clock input signal.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A tunable delay-locked loop, comprising:
   a receiver for receiving a clock signal;
   a delay line for producing a plurality of signals in response to said clock signal, each of said plurality of signals being delayed a predetermined period of time with respect to said clock signal;
   a first feedback loop responsive to said delay line for producing a first feedback signal input to said delay line;
   a variable delay circuit interposed between said receiver and said delay line; and
   a second feedback loop responsive to said delay line for producing a second feedback signal input to said variable delay circuit.

2. The delay-locked loop of claim 1 additionally comprising a plurality of multiplexers responsive to said delay line and a driver responsive to said plurality of multiplexers, said plurality of multiplexers and said driver having an amount of delay associated therewith, and wherein said second feedback loop includes a delay matching circuit having substantially the same amount of delay as said delay associated with said plurality of multiplexers and said driver.

3. The delay locked-loop of claim 2 wherein said plurality of multiplexers includes four 4×1 multiplexers responsive to said delay line and controlled by two control bits, and two 4×1 multiplexers responsive to said four 4×1 multiplexers and controlled by two other control bits.

4. The delay locked-loop of claim 1 wherein said variable delay circuit includes a plurality of voltage controlled variable delay stages.

5. A synchronous clock generator, comprising:
   a receiver for receiving an external clock signal;
   a delay-locked loop for producing a plurality of signals in response to the external clock signal, each of said signals being delayed a predetermined period of time with respect to said external clock signal;
   a plurality of multiplexers responsive to said plurality of signals for producing at least one clock signal in response to control signals input to said plurality of multiplexers;
   a clock driver for driving said at least one clock signal;
   a variable delay circuit positioned to delay said external clock signal before being input to said delay-locked loop; and
   a compound feedback loop responsive to certain of said plurality of signals for producing a control signal input to said variable delay circuit.

6. The clock generator of claim 5 wherein said compound feedback loop includes a delay matching circuit having a delay associated therewith that is substantially equal to a delay associated with said plurality of multiplexers and said clock driver.

7. The clock generator of claim 5 additionally comprising a second receiver for receiving a second external clock signal, and a delay line for producing a second plurality of signals in response to said second external clock signal and said delay-locked loop, each of said second plurality of signals being delayed a predetermined period time with respect to said second external clock signal.

8. The clock generator of claim 7 additionally comprising a second variable delay circuit positioned to delay said second external clock signal before being input to said delay line, said second variable delay line being responsive to said control signal.

9. A synchronous clock generator, comprising:
   a clock receiver for receiving an external clock signal;
   a delay-locked loop responsive to said clock receiver for producing a plurality of signals, each of said signals being delayed a predetermined period of time with respect to said external clock signal;
   a plurality of multiplexers responsive to said plurality of signals for producing at least one clock signal in response to control signals input to said plurality of multiplexers;
   a clock driver for driving said at least one clock signal;
   a variable delay circuit positioned to delay said external clock signal before being input to said delay locked-loop;

a data receiver for receiving said external clock signal; and a compound feedback loop responsive to said data receiver and at least one of said plurality of signals for producing a control signal input to said variable delay circuit.

10. The clock generator of claim 9 wherein said clock receiver is optimized for operation with said delay-locked loop and wherein said data receiver is matched to another receiver used to receive data.

11. The clock generator of claim 9 wherein said compound feedback loop includes a delay matching circuit having a delay associated therewith that is substantially equal to a delay associated with said plurality of multiplexers and said clock driver.

12. A delay locked-loop, comprising:

a receiver for receiving a clock signal;

a delay line responsive to said receiver for producing a plurality of signals, each of said plurality of signals being delayed a predetermined period of time with respect to said clock signal;

a first phase detector responsive to said clock signal and to one of said plurality of signals;

a first charge pump responsive to said first phase detector for producing a first feedback signal input to said delay line;

a variable delay circuit interposed between said receiver and said delay line;

a data receiver for receiving said external clock signal;

a delay matching circuit responsive to one of said plurality of signals;

a second phase detector responsive to said data receiver and said delay matching circuit; and a second charge pump responsive to said second phase detector for producing a second feedback signal input to said variable delay circuit.

13. The delay-locked loop of claim 12 additionally comprising a plurality of multiplexers responsive to said delay line and a driver responsive to said plurality of multiplexers, said plurality of multiplexers and said driver having an amount of delay associated therewith, and wherein said delay matching circuit has substantially the same amount of delay as said delay associated with said plurality of multiplexers and said driver.

14. The delay-locked loop of claim 12 wherein said receiver is optimized for operation with said delay line and wherein said data receiver is matched to another receiver used to receive data.

15. A circuit, comprising:

a control clock receiver for receiving a control clock signal;

a delay-locked loop responsive to said control clock receiver for producing a plurality of signals, each of said signals being delayed a predetermined period of time with respect to said control clock signal;

a first plurality of multiplexers responsive to said plurality of signals for producing at least one delayed control clock signal in response to control signals input to said plurality of multiplexers;

a control data receiver for receiving control data;

a latch responsive to said control data receiver and said delayed control clock signal;

a first variable delay circuit positioned to delay said external clock signal before being input to said delay-locked loop;

a compound feedback loop responsive to at least one of said plurality of signals for producing a control signal input to said variable delay circuit;

a data clock receiver for receiving a data clock signal;

a delay line responsive to said data clock receiver and said delay-locked loop for producing a second plurality of signals, each of said second plurality of signals being delayed a predetermined period of time with respect to said data clock signal;

a plurality of multiplexers responsive to said second plurality of signals for producing at least one delayed data clock signal in response to control signals input to said second plurality of multiplexers;

a data receiver for receiving data; and a latch responsive to said data receiver and said delayed data clock signal.

16. The circuit of claim 15 additionally comprising a second variable delay circuit positioned to delay said data clock signal before being input to said delay line, said second variable delay line being responsive to said control signal.

17. The circuit of claim 15 additionally comprising a second data receiver for receiving said control clock signal, said compound feedback loop being additionally responsive to said second data receiver.

18. A system, comprising:

a processor;

a memory controller;

a plurality of memory devices;

a first bus interconnecting said processor and said memory controller;

a second bus interconnecting said memory controller and said memory devices;

each of said memory devices having a synchronous clock generator, comprising;

a delay-locked loop for producing a plurality of signals in response to an externally supplied clock signal, each of said signals being delayed a predetermined period of time with respect to said externally supplied clock signal;

a plurality of multiplexers responsive to said plurality of signals for producing a plurality of clock signals in response to control signals input to said plurality of multiplexers;

a variable delay circuit positioned to delay said externally supplied clock signal before being input to said delay-locked loop; and a compound feedback loop responsive to certain of said plurality of signals for producing a control signal input to said variable delay circuit.

19. A method of tuning a synchronous clock generator, comprising:

determining the amount of delay between a signal line output from a delay line and an output of a clock driver receiving the signal from the delay line; and adjusting the delay of a clock signal applied to drive the delay line by an amount of time substantially equal to the determined amount of delay between the signal line output from the delay line to the output of the clock driver.

20. The method of claim 19 wherein the determining step is carried out by simulating the delay between the signal line output from the delay line and the output of the clock driver.

21. A clock generator circuit for providing a first sequence of clock signals that have respective phases relative to a continuous master clock signal and a second sequence of clock signals that have respective phases relative to a discontinuous master clock signal, comprising:

a first delay-locked loop generating the first sequence of clock signals, the first sequence of clock signals being increasingly delayed from a first clock signal to a last clock signal, and two of the clock signals in the sequence being delay locked to each other so that they have a predetermined phase with respect to each other;

a second delay-locked loop that delay locks one of the clock signals in the first sequence to the continuous master clock signal so that the clock signals in the first sequence have respective phases with respect to the continuous master clock signal;

a first delay circuit that generates the second sequence of clock signals in response to a delayed data clock signal, the second sequence of clock signals being increasingly delayed from a first clock signal to a last clock signal, the first delay circuit coupled to the first delay-locked loop to receive a first control signal, and delaying two of the clock signals in the second sequence to have a predetermined phase with respect to each other responsive to the first control signal; and a second delay circuit adapted to receive the discontinuous master clock signal and coupled to the second delay-locked loop to receive a second control signal, the second delay circuit applying the delayed data clock signal to the first delay circuit and the delayed data clock signal being delayed relative to the discontinuous master clock signal responsive to the second control signal.

22. The clock generator of claim 21 wherein the first delay circuit operates responsive to the first control signal to delay the two of the clock signals in the second sequence to have the same predetermined phase with respect to each other as the corresponding two signals in the first sequence of the signals from the first delay-locked loop.

23. The clock generator of claim 21 wherein the second delay circuit operates responsive to the second control signal to delay the delayed data clock signal relative to the discontinuous master clock signal so each of the clock signals in the second sequence has the same delay relative to the discontinuous master clock signal as does a corresponding clock signal in the first sequence relative to the continuous master clock signal.

24. The clock generator circuit of claim 21 wherein the first delay-locked loop locks the first clock signal and last clock signal to each other so that the first clock signal and the last clock signal have a predetermined phase with respect to each other.

25. The clock generator circuit of claim 24 wherein the first clock signal and the last clock signal are delay locked to each other so that they have a 180 degree phase shift relative to each other.

26. The clock generator circuit of claim 21 wherein the clock signals in each of the first and second sequences are increasingly delayed in equal increments from the first clock signal to the last clock signal so that adjacent clock signals in the sequence have respective phases that are equally spaced from each other.

27. The clock generator circuit of claim 21 wherein the second delay-locked loop delay locks the one of the clock signals in the first sequence to the continuous master clock signal so that they have substantially the same phase, and the second delay circuit delays the delayed data clock signal so that one of the clock signals in the second sequence has the same phase relative to the discontinuous master clock signal as the phase of the one of the clock signals in the first sequence relative to the continuous master clock.

28. The clock generator circuit of claim 21 wherein the first delay-locked loop comprises:

a first voltage controlled delay circuit receiving a reference clock signal and generating the first sequence of clock signals from the reference clock signal by delaying the reference clock signal by respective delays that are a function of a first control signal;

a first phase detector comparing the phase of two of the clock signals in the first sequence and generating the first control signal as a function of the difference between those two clock signals; and wherein the second delay-locked loop comprises:

a second voltage controlled delay circuit receiving the continuous master clock signal and generating the reference clock signal having a delay relative to the continuous master clock signal that is a function of a second control signal; and a second phase detector comparing the phase of the continuous master clock signal to the phase of one of the clock signals in the first sequence and generating the second control signal as a function of the difference between those two clock signals; and wherein the first delay circuit comprises:

a third voltage controlled delay circuit receiving the delayed data clock signal and generating the second sequence of clock signals from the delayed data clock signal by delaying the delayed data clock signal by respective delays that are a function of the first control signal; and wherein the second delay circuit comprises:

a fourth voltage controlled delay circuit receiving the discontinuous master clock signal and generating the delayed data clock signal having a delay relative to the discontinuous master clock signal that is a function of the second control signal.

29. The clock generator circuit of claim 21, further comprising first and second multiplexers coupled to the first delay-locked loop and first delay circuit, each receiving the corresponding sequence of clock signals and coupling one of the clock signals to a corresponding clock output terminal responsive to corresponding address signals.

30. A method of generating a sequence of clock signals, comprising:

delay locking a first reference clock signal to a continuous master clock signal so that the first reference clock signal has a predetermined phase relative to the phase of the continuous master clock signal;

delay locking a first plurality of clock signals to the first reference clock signal so that the first plurality of clock signals have respective phases relative to the phase of the first reference clock signal;

delaying a second reference clock signal relative to a discontinuous master clock signal so that the second reference clock signal has the same predetermined phase relative to the phase of the discontinuous master clock signal as the predetermined phase of the first reference clock signal relative to the phase of the continuous master clock signal; and delaying a second plurality of clock signals relative to the second reference clock signal so that the second plurality of clock signals have the same respective phases relative to the phase of the second reference clock signal as the respective phases of the first plurality of clock signals relative to the first reference clock signal.

31. The method of claim 30 wherein the first reference clock signal is locked to the same phase as the continuous master clock signal.

32. A method of generating first and second sequences of clock signals from a command clock signal and a data clock signal, respectively, comprising:

generating the first sequence of clock signals each of which has a respective phase relative to the command clock signal that increases from a first clock signal to a last clock signal in the sequence;

delay locking the first clock signal and last clock signal to each other so that they have a predetermined phase with respect to each other;

delay locking one of the clock signals to the command clock signal so that each of the clock signals in the first sequence has a respective phase with respect to the command clock signal;

generating the second sequence of clock signals each of which has a respective phase relative to the data clock signal that increases from a first clock signal to a last clock signal in the second sequence;

delaying the first and last clock signals in the second sequence to each other so that they have the same predetermined phase with respect to each other as the first and last clock signals in the first sequence; and delaying one of the clock signals in the second sequence relative to the data clock signal so that each of the clock signals in the second sequence has the same respective phase with respect to the data clock signal as the corresponding clock signal in the first sequence relative to the command clock signal.

33. The method of claim 32 wherein delay locking the first clock signal and the last clock signal in the first sequence comprises delay locking the first clock signal and the last clock signal so that they have respective phases that are 180 degrees from each other.

* * * * *